United States Patent
Lee (10) Patent No.: US 10,084,007 B2
(45) Date of Patent: Sep. 25, 2018

(54) IMAGE SENSOR HAVING PICKUP REGION

(71) Applicant: SK hynix Inc., Gyeonggi-do (KR)

(72) Inventor: Woong-Hee Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 48 days.

(21) Appl. No.: 15/173,326

(22) Filed: Jun. 3, 2016

(65) Prior Publication Data

US 2017/0200761 A1    Jul. 13, 2017

(30) Foreign Application Priority Data

Jan. 11, 2016  (KR) .................. 10-2016-0003084

(51) Int. Cl.
*H01L 27/146*    (2006.01)
*H04N 5/359*    (2011.01)

(52) U.S. Cl.
CPC .... *H01L 27/14654* (2013.01); *H01L 27/1463* (2013.01); *H01L 27/14605* (2013.01); *H01L 27/14636* (2013.01); *H04N 5/3591* (2013.01)

(58) Field of Classification Search
CPC ......... H01L 27/14654; H01L 27/14636; H01L 27/1463; H01L 27/14605; H04N 5/3591; H04N 5/3532; H04N 5/3698
See application file for complete search history.

(56) References Cited

U.S. PATENT DOCUMENTS

| | | | |
|---|---|---|---|
| 7,459,668 B2 | 12/2008 | Mauritzson | |
| 7,884,436 B2 | 2/2011 | Mabuchi | |
| 8,922,685 B2 * | 12/2014 | Nakata | H04N 5/35554 |
| | | | 250/208.1 |
| 9,165,959 B2 * | 10/2015 | Chen | H01L 27/14605 |
| 2010/0134668 A1 | 6/2010 | Park et al. | |
| 2010/0177226 A1 * | 7/2010 | Itonaga | H01L 27/14603 |
| | | | 348/300 |
| 2012/0025060 A1 * | 2/2012 | Iwata | H01L 27/14603 |
| | | | 250/208.1 |

\* cited by examiner

*Primary Examiner* — Hung Lam
(74) *Attorney, Agent, or Firm* — IP & T Group LLP (57) ABSTRACT

The present invention provides an image sensor. An image sensor include a pixel array. The pixel array includes: a plurality of pixels; and an isolation structure suitable for insulating between the plurality of pixels. The isolation structure includes: a first conductivity-type conductive layer formed over a substrate; and a second conductivity-type pickup region formed in the first conductivity-type conductive layer and disposed between each plurality of pixels.

18 Claims, 6 Drawing Sheets

IMAGE SENSOR HAVING PICKUP REGION

CROSS-REFERENCE TO RELATED APPLICATIONS

The present application claims priority of Korean Patent Application No. 10-2016-0003084, entitled "IMAGE SENSOR" and filed on Jan. 11, 2016, which is herein incorporated by reference in its entirety.

BACKGROUND

Exemplary embodiments of the present invention relate generally to a semiconductor device and more particularly, to an image sensor.

Image sensors convert optical images into electrical signals. With the development of the computer and communication industries, a demand for image sensors having improved performance in various applications, such as digital cameras, camcorders, smart phones, game machines, security cameras, medical micro cameras, robots and the like has been increasing.

SUMMARY

An embodiment of the present invention is directed to an image sensor having an improved performance.

In accordance with an embodiment of the present invention, an image sensor may include: a plurality of unit pixel groups; and an isolation structure suitable for insulating between the plurality of unit pixel groups. The isolation structure includes: a first conductivity-type conductive layer formed over a substrate; and a second conductivity-type pickup region formed in the first conductivity-type conductive layer and disposed between each plurality of unit pixel groups. Furthermore, the isolation structure may further includes: an element isolation layer formed over the first conductivity-type conductive layer and having a bottom surface in contact with the second conductivity-type pickup region; and a plug formed through the element isolation layer and connected to the second conductivity-type pickup region.

A positive voltage variable within a voltage range from a voltage higher than a ground voltage to a voltage equal to or lower than a supply voltage may be applied to the second conductivity-type pickup region. The plurality of unit pixel groups operate in a global shutter mode, a positive voltage may be applied to the second conductivity-type pickup region during an integration time. The plurality of unit pixel groups operate in a rolling shutter mode, a positive voltage may be always applied to the second conductivity-type pickup region. The first conductivity-type conductive layer may include either a first conductivity-type well formed in the substrate, or a first conductivity-type epitaxial layer formed over the substrate. Each unit pixel groups may includes: a light-receiving part comprising a plurality of photoelectric conversion elements suitable for generating photocharges in response to incident light and sharing a single floating diffusion region; and an output part suitable for outputting an image signal corresponding to the photocharges generated in the light-receiving part. The second conductivity-type pickup region may be disposed between each light-receiving part. The second conductivity-type pickup region may have a dot shape.

In accordance with another embodiment of the present invention, an image sensor include: a plurality of unit pixel groups; an isolation structure suitable for insulating between the plurality of unit pixel groups; and a first pickup region of a first conductivity-type formed in the isolation structure and disposed between each plurality of unit pixel groups. The isolation structure may includes: a first conductivity-type conductive layer; and a second pickup region of a second conductivity-type formed in the first conductivity-type conductive layer and disposed between each plurality of unit pixel groups. Furthermore, the isolation structure may further includes: an element isolation layer formed over the first conductivity-type conductive layer and having a bottom surface in contact with the first and second pickup regions; a first plug formed through the element isolation layer and connected to the first pickup region; and a second plug formed through the element isolation layer and connected to the second pickup region.

A positive voltage variable within a voltage range from a voltage higher than a ground voltage to a voltage equal to or lower than a supply voltage may be applied to the second pickup region. The plurality of unit pixel groups operate in a global shutter mode, a positive voltage may be applied to the second pickup region during an integration time. The plurality of unit pixel groups operate in a rolling shutter mode, a positive voltage may be always applied to the second pickup region. A ground voltage may be applied to the first pickup region. The first conductivity-type conductive layer may include either a first conductivity-type well formed in the substrate, or a first conductivity-type epitaxial layer formed over the substrate. Each unit pixel groups may includes: a light-receiving part comprising a plurality of photoelectric conversion elements suitable for generating photocharges in response to incident light and sharing a single floating diffusion region; and an output part suitable for outputting an image signal corresponding to the photocharges generated in the light-receiving part. The first pickup region may be disposed between each output parts. The second pickup region may be disposed between each light-receiving parts. The first and second pickup regions may have a dot shape.

DETAILED DESCRIPTION

Exemplary embodiments of the present invention will be described below in detail with reference to the accompanying drawings.

The drawings may not be necessarily to scale and in some instances, proportions of at least some structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments of the present invention, as described below, provide an image sensor having an improved performance. The improved performance may refer to a capability of providing high-pixel images. More specifically, it may refer to suppressing the blooming phenomenon that typically increases as the integration density of the image sensor increases to provide high-pixel images.

Figure 1:
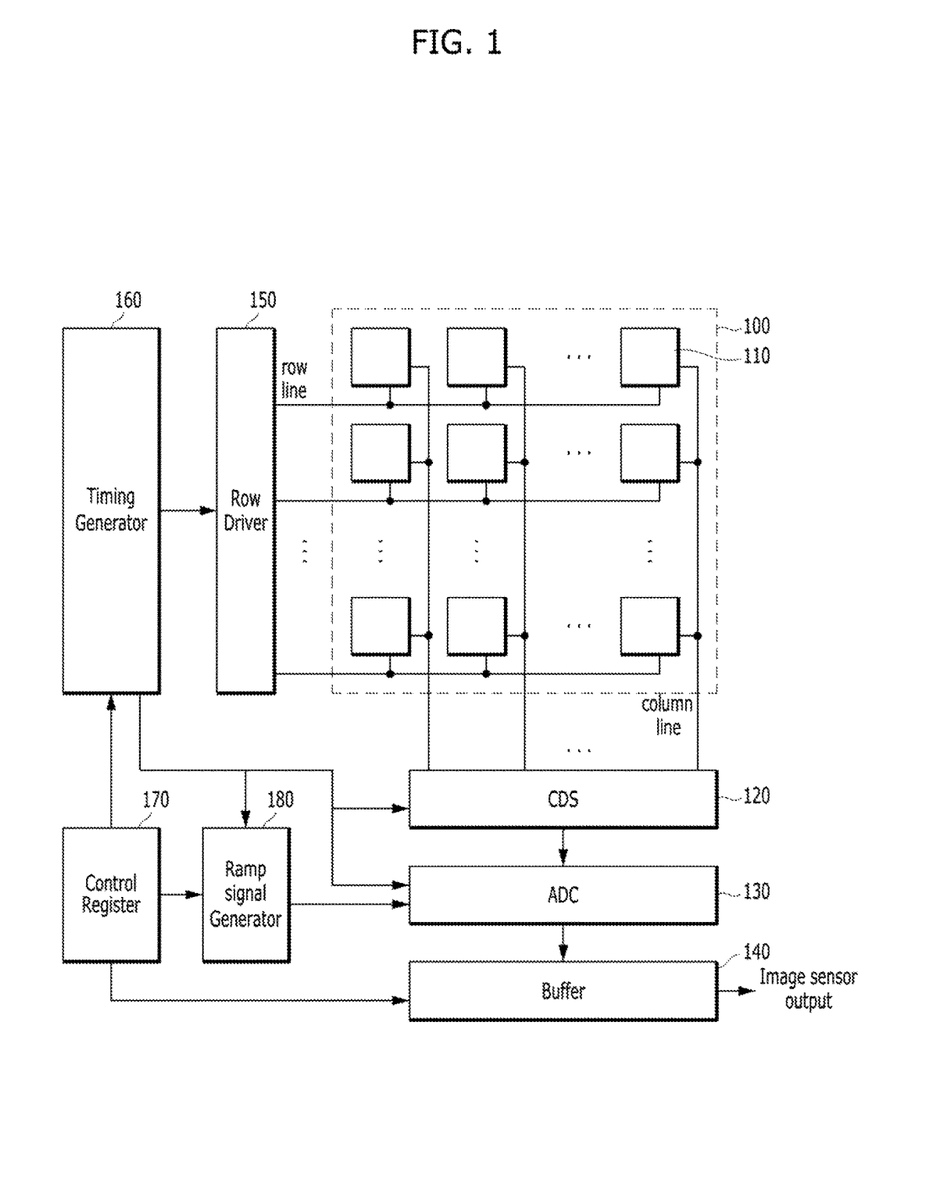
FIG. 1 is a block diagram schematically illustrating an image sensor, according to an embodiment of the present invention.

As illustrated in FIG. 1, an image sensor according to an embodiment of the present invention may include a pixel array 100, a correlated double sampling unit (CDS) 120, an analog-to-digital converter (ADC) 130, a buffer 140, a row driver 150, a timing generator 160, a control register 170, and a ramp signal generator 180. The pixel array 100 may include a plurality of unit pixel groups 110 (or pixels) arranged in a matrix structure.

The timing generator 160 may generate control signals for controlling the operations of the row driver 150, the correlated double sampling unit 120, the analog-to-digital converter 130, and the ramp signal generator 180. The control register 170 may generate control signals for controlling the operations of the ramp signal generator 180, the timing generator 160, and the buffer 140.

The row driver 150 may drive the pixel array 100 on a unit basis of row lines, i.e., one or more row lines each time. For example, the row driver 150 may generate a selection signal capable of selecting one row line from the plurality of row lines. One or more unit pixel groups 110 may be coupled to each row line whereas only one row line may be coupled to each unit pixel groups 110. In the embodiment of FIG. 1, a plurality of unit pixel groups 110 is coupled to each row line.

Each unit pixel groups 110 may detect incident light to output an image reset signal and an image signal to the correlated double sampling unit 120 through a corresponding column line. The correlated double sampling unit 120 may sample each received image signal and each image reset signal. One or more unit pixel groups 110 may be coupled to each column line whereas only one column line may be coupled to each unit pixel groups 110. The analog-to-digital converter 130 may compare a ramp signal received from the ramp signal generator 180 with a sampling signal received from the correlated double sampling unit 120 to generate a comparison signal. The analog-to-digital converter 130 may count a level transition time of the comparison signal based on a clock signal received from the timing generator 160 to output a count value to the buffer 140. The ramp signal generator 180 may operate under the control of the timing generator 160.

The buffer 140 may store a plurality of count values outputted from the analog-to-digital converter 130 as digital signals. The buffer 140 may sense-amplify and output the count values. The buffer 140 may include a memory (not illustrated) for storing the count values associated with the signals outputted from the unit pixel groups 110. The buffer 140 may further include a sense amplifier (not illustrated) for sensing and amplifying the count values outputted from the memory.

For providing high-resolution images, the number of pixels integrated in a pixel array 100 should generally be high. Because an increased number of pixels should be arranged within a limited area, the size of each pixel has been gradually decreasing. Further, for achieving a maximum fill factor within a decreased size pixel, an image sensor having a plurality of unit pixel groups 110 which have a shared pixel structure has been introduced. However, a disadvantage exists, because as the pixel size decreases, the image quality may also be reduced due to a blooming phenomenon in which a photocharge generated in a photoelectric conversion element flows into adjacent photoelectric conversion elements.

Various embodiments of the present invention as described below with reference to the accompanying drawings, are directed to an image sensor capable of suppressing the blooming phenomenon.

Figure 2:
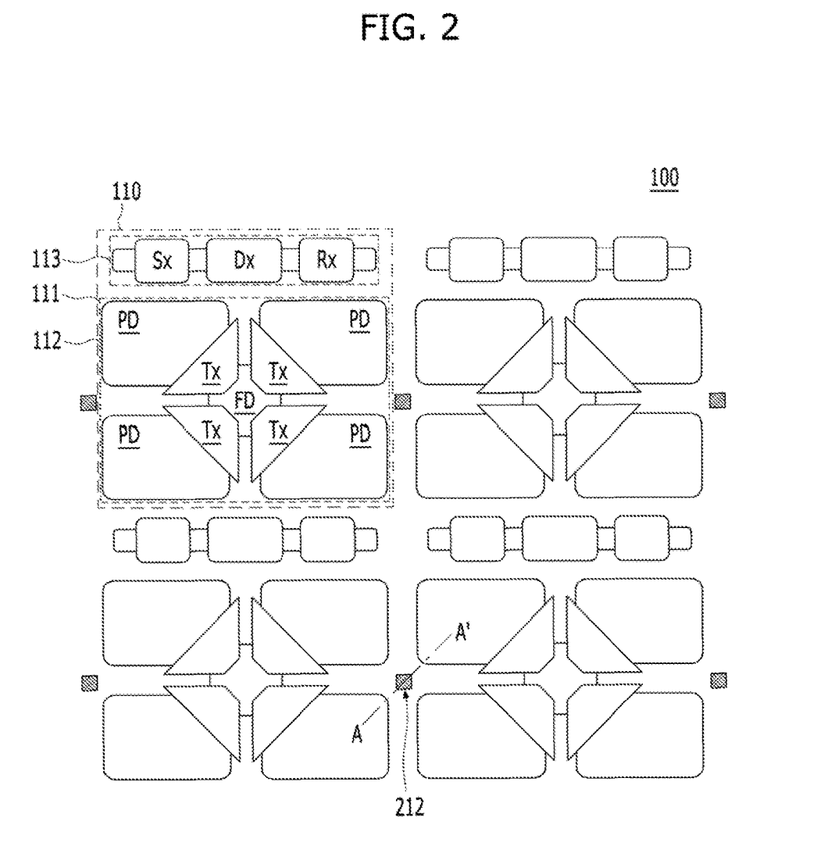
FIG. 2 is a top view partially illustrating a pixel array according to first and second embodiments of the present invention.
Figure 3:
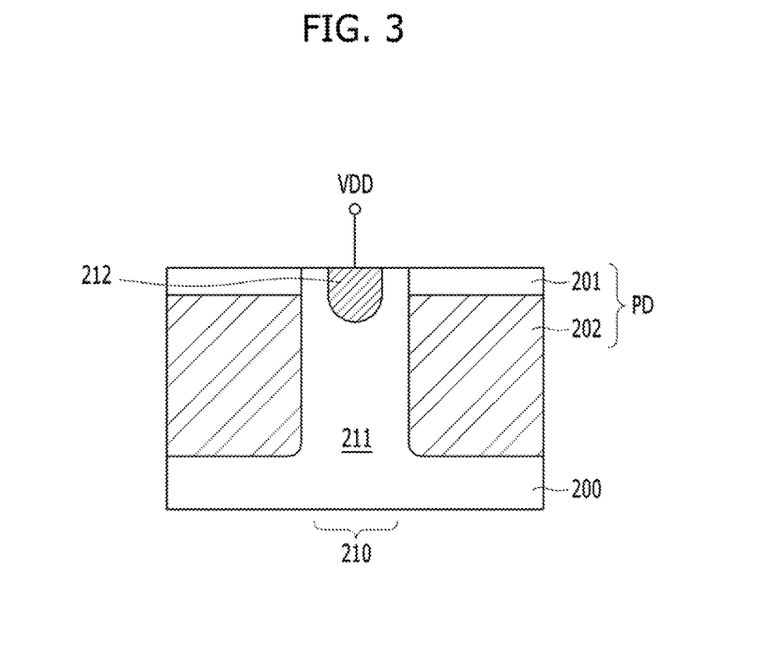
FIG. 3 is a cross-sectional view taken along line A-A' of the pixel array shown in FIG. 2, according to the first embodiment of the present invention.

FIG. 2 is a top view specifically illustrating a part of a pixel array in an image sensor according to first and second embodiments of the present invention. FIG. 3 is a cross-sectional view taken along line A-A' of a pixel array shown in FIG. 2, according to the first embodiment of the present invention.

As shown in FIGS. 2 and 3, the pixel array 100, according to the first embodiment of the present invention, may include a plurality of unit pixel groups 110, and an isolation structure 210 for insulating between the plurality of unit pixel groups 110.

In the pixel array 100 according to the first embodiment, each unit pixel groups 110 may include a light-receiving part 111 configured to generate photocharges in response to incident light, and an output part 113 configured to output an image signal corresponding to an amount of the photocharges generated in the light-receiving part 111.

The light-receiving part 111 may include one or more light-receiving units 112 that may share a single floating diffusion region FD. Each light-receiving unit 112 may include a photoelectric conversion element PD configured to generate photocharges in response to incident light, and a transfer transistor Tx configured to transfer the photocharges generated in the photoelectric conversion element PD, to the floating diffusion region FD in response to a transmission signal. The photoelectric conversion element PD may be any suitable photoelectric conversion element. For example, the photoelectric conversion element PD may include a photo-diode (not shown). According to the first embodiment illustrated in FIG. 2, four light-receiving units 112 share a single floating diffusion region FD. The four light-receiving units 112 may be arranged so as to surround the floating diffusion region FD for optimizing space utilization.

The output part 113 may output an image signal to a column line in response to a selection signal applied through a row line. The output part 113 may include a reset transistor Rx, a source follower transistor Dx, and a selection transistor Sx. In each unit pixel groups 110, the output part 113 may be located at one side of the light-receiving part 111 when viewed in the column direction. For example, according to the first embodiment, the output part 113 may be located above the light-receiving part 111 when viewed in the column direction.

In the pixel array 100 according to the first embodiment, the isolation structure 210 may insulate between the plurality of unit pixel groups 110 and, at the same time, may also insulate between the photoelectric conversion element PD, the light-emitting part 111 and the output part 113 in each unit pixel groups 110. The isolation structure 210 may include conductive layer 211 formed on a substrate 200, and a pickup region 212 formed on the conductive layer 211 and disposed between two adjacent unit pixel groups 110. The conductive layer 211 may be or include a first conductivity type layer. The pick-up region may be or include second conductivity type layer. The first conductivity type and the second conductivity type may be opposite conductivity types. For example, the first conductivity type may be a P-type, and the second conductivity type may be an N-type.

The substrate 200 may include a semiconductor substrate. The semiconductor substrate may include a silicon-containing material in a single crystal state. For example, the substrate 200 may include a single crystal silicon-containing material.

The first conductivity-type, conductive layer 211 may include the same material as that of the substrate 200. For example, the conductive layer 211 may include a silicon-containing material. Specifically, the conductive layer 211 may include either a first conductivity-type well 211 formed in the substrate 200, or a first conductivity-type epitaxial layer formed on the substrate 200. The first embodiment illustrates the case in which the conductive layer may be a first conductivity-type well 211 (i.e., a P-type well 211) and the P-type well may be formed throughout the substrate 200. Thus, the "conductive layer" and "well" will be indicated by the same reference numeral "211".

Herein, the photoelectric conversion elements PD in the light-receiving part 111 may be formed inside the conductive layer 211. Each transfer transistor Tx may be formed on top of the conductive layer 211. Each photoelectric conversion element PD may include a photodiode, and the photodiode may have a vertical stack of a P-type impurity region 201 and an N-type impurity region 202.

The second conductivity-type, pickup region 212 may serve to suppress the blooming phenomenon, and may be disposed between two adjacent unit pixel groups 110. The pickup region 212 may have a dot shape. To effectively suppress the blooming phenomenon, the pickup region 212 may be disposed between two adjacent light-receiving units 112 of the light-receiving parts 111 of each unit pixel groups 110. For example, the pickup region 212 may be located in the center between adjacent photoelectric conversion elements PD. Accordingly, the blooming phenomenon may be effectively suppressed, and the pickup region 212 maybe disposed without a special change in the layout. The pickup regions 212 and the floating diffusion regions FD may be alternately arranged in any direction, for example, the row direction.

To more effectively suppress the blooming phenomenon, a positive voltage higher than a ground voltage (GND) may be applied to the pickup region 212. Specifically, a positive voltage, which is higher than the ground voltage (GND) and equal to or lower than the supply voltage (VDD), may be applied to the pickup region 212. Herein, the voltage applied to the pickup region may be varied within the above-described positive voltage range. For example, the voltage applied to the pickup region 212 may be changed based on a noise signal generated in a dark image. Specifically, as the noise signal increases, a voltage closer to the level of the supply voltage (VDD) may be applied to the pickup region 212. In addition, the time point at which a voltage is applied to the pickup region 212 may vary depending on a shutter mode. Specifically, if a rolling shutter mode may be used, a given voltage may always be applied to the pickup region 212. On the other hand, if a global shutter mode may be used, a given voltage may be applied to the pickup region 212 always or only during an integration time. The voltage applied to the pickup region 212 during the integration time may be supplied in a pulse form, which is advantageous in terms of power consumption. For example, the term "integration time" may refer to a time during which photocharges may be generated by irradiating the incident light to the photoelectric conversion element PD, for example, a time during which the photoelectric conversion element PD may be exposed to the incident light.

As described above, the pixel array 100 according to the first embodiment includes the isolation structure 210 including the pickup region 212, which may effectively suppress the blooming phenomenon.

Figure 4:
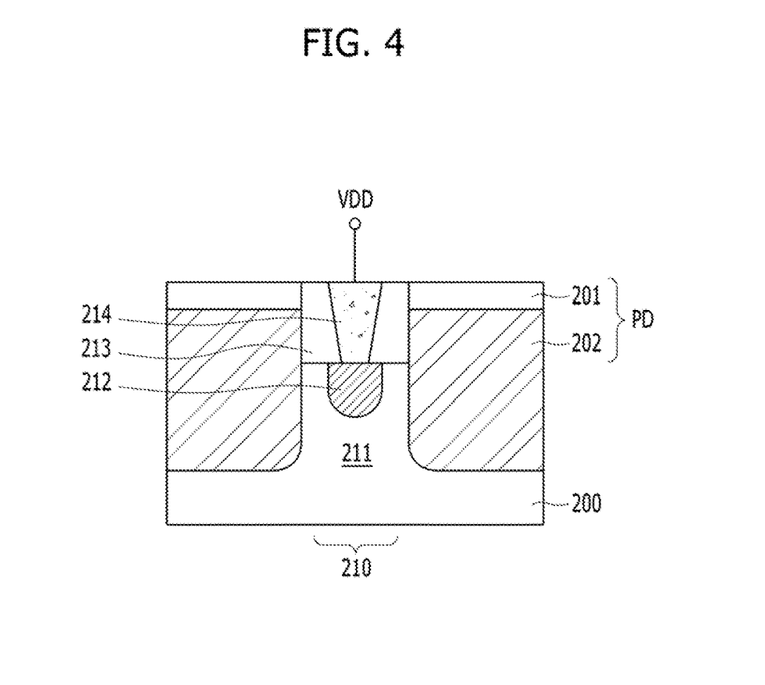
FIG. 4 is a cross-sectional view taken along line A-A' of the pixel array shown in FIG. 2, according to the second embodiment of the present invention.

FIG. 4 is a cross-sectional view taken along ling A-A' of FIG. 2, which illustrates a pixel array according to the second embodiment of the present invention. For convenience of explanation, the same reference numerals as those used in the first embodiment will be used, and the detailed description of the same elements as those used in the first embodiment will be omitted.

As shown in FIGS. 2 and 4, the pixel array 100 according to the second embodiment of the present invention may include a plurality of unit pixel groups 110, and an isolation structure 210 for insulating between the plurality of unit pixel groups 110.

In the pixel array 100 according to the second embodiment, the isolation structure 210 may include, in addition to the isolation structure according to the first embodiment, an element isolation layer 213, and a plug 214 formed through the element isolation layer 213.

Specifically, the isolation structure 210 according to the second embodiment may include, a first conductivity-type conductive layer 211 formed on a substrate 200, an element isolation layer 213 formed on the conductive layer 211 to insulate between the plurality of unit pixel groups 110, second conductivity-type pickup regions 212 formed in the conductive layer 211 and under the element isolation layer 213 and disposed between two adjacent unit pixel groups 110, and a plurality of plugs 214 formed through the element isolation layer 213 to be electrically connected to the pickup regions 212, respectively. The element isolation layer 213 may be formed by a shallow trench isolation (STI) process. The element isolation layer 213 may be either a single layer made of any suitable dielectric material, for example, one selected from a group of dielectric materials including an oxide, nitride, and oxynitride, and any combination thereof. The element isolation layer may be a multi-layer made of two or more layers each layer including one or more suitable dielectric materials including an oxide, nitride, and oxynitride, and any combination thereof. The plug 214 formed through the element isolation layer 213 may be used to apply a given voltage to the pickup region 212 and may have a pillar shape that overlaps at least partially the pickup region 212. The plug 214 may be tapered with the smallest cross-section at the interface with the pickup region 212.

As described above, the pixel array 100 according to the second embodiment may include the isolation structure 210 including the pickup region 212, which may effectively suppress the blooming phenomenon.

Figure 5:
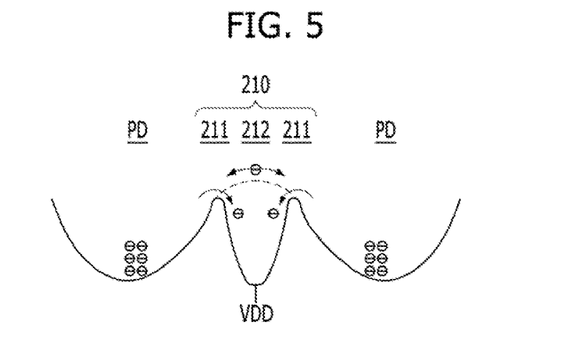
FIG. 5 is a graph schematically illustrating a potential barrier corresponding to line A-A' of FIG. 2.

Hereinafter, a principle by which the blooming phenomenon may be suppressed by the pickup region 212 will be described with reference to FIG. 5. FIG. 5 is a graph schematically illustrating a potential barrier corresponding to line A-A' of FIG. 2.

As shown in FIG. 5, photoelectrons may be accumulated in the photoelectric conversion element PD surrounded by the first conductivity-type conductive layer 211, for example, the P-type well 211. If the second conductivity-type pickup region 212, for example, the N-type pickup region 212, is not present, the potential barrier in the P-type well may be formed as indicated by the dotted line, and the photocharges excessively generated in the photoelectric conversion element PD will cross over the potential barrier of the P-type well 211 to the adjacent photoelectric conversion element PD to cause the blooming phenomenon.

However, if the N-type pickup region 212 is provided as described in the above embodiments, even if the photocharges excessively generated in the photoelectric conversion element PD cross over the potential barrier of the P-type well 211, these photocharges will be removed by a voltage (e.g., supply voltage (VDD)) applied to the N-type pickup region 212, and thus will not affect the adjacent photoelectric conversion element PD.

In addition, the N-type pickup region 212 may also suppress a dark current occurring when the charges generated in the P-type well 211 may flow into the photoelectric conversion element PD. Specifically, minority-carrier electrons generated in the P-type well 211, due to an incident light entering the P-type well 211, an increase in an operating temperature, or some other reason, may be removed by the N-type pickup region 212.

As described above, since the N-type pickup region 212 may suppress the blooming phenomenon and the generation of a dark current, an image sensor including the pixel array 100 according to the embodiments of the present invention may provide a clear and distinct image signal.

Meanwhile, in the first and second embodiments as described above, in order to suppress the blooming phenomenon by the pickup region 212 to which a positive voltage may be applied, the first conductivity-type conductive layer 211, for example, the P-type well 211, should be maintained at a constant voltage level, for example, a ground voltage (GND) level. Generally, because a ground voltage (GND) applied to the P-type well 211 may be supplied from the outermost part of the pixel array 100, a voltage level of an edge of the pixel array 100 may differ from a voltage level of the P-type well 211 in the image sensor. For this reason, the characteristics of the image sensor may deteriorate. Thus, the third and fourth embodiments of the present invention as described below, are directed to a method for suppressing the blooming phenomenon and, at the same time, maintaining the voltage level of the P-type well 211 at a constant level regardless of a position of the pixel array 100.

Figure 6:
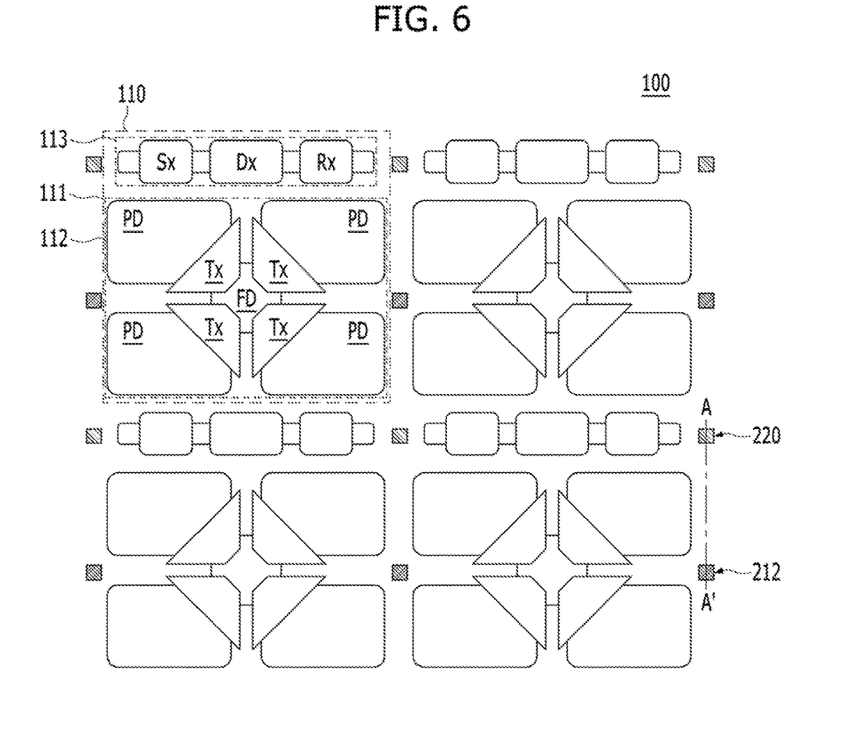
FIG. 6 is a top view partly illustrating a pixel array according to third and fourth embodiments of the present invention.
Figure 7:
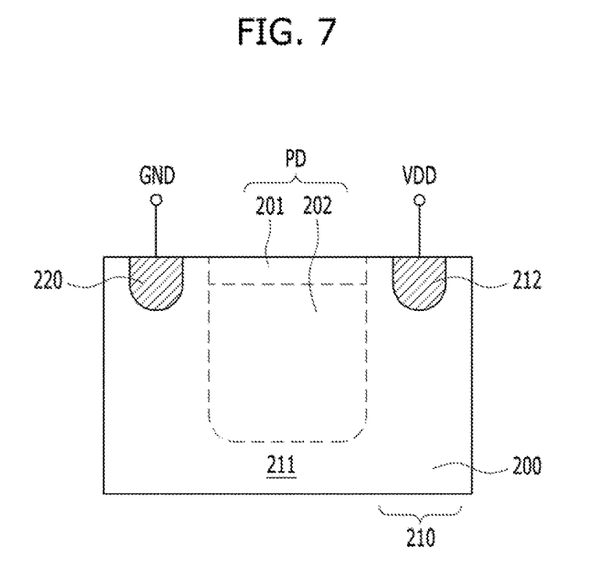
FIG. 7 is a cross-sectional view taken along line A-A' of the pixel array shown in FIG. 6, according to the third embodiment of the present invention.

FIG. 6 illustrates pixel arrays according to the third and fourth embodiments of the present invention, and, more specifically, FIG. 6 is a top view illustrating only a part of the pixel arrays. FIG. 7 is a cross-sectional view taken along line A-A' of the pixel array of FIG. 6, according to the third embodiment.

As shown in FIGS. 6 and 7, the pixel array 100 according to the third embodiment may include a plurality of unit pixel groups 110, an isolation structure 210 for isolating between the plurality of unit pixel groups 110, and a first pickup region 220 of a first conductivity-type formed in the isolation structure 210. Herein, the plurality of unit pixel groups 110 and the isolation structure 210 including the second pickup region 212 may be substantially the same as those described in the first embodiment, and thus a detailed description thereof will be omitted. For reference, the second pickup region 212 in the third embodiment is substantially the same as the pickup region 212 in the first embodiment.

In the pixel array 100 according to the third embodiment, the first pickup region 220 of the first conductivity-type may serve to maintain the first conductivity-type conductive layer 211 (e.g., the P-type well 211) at a constant voltage level regardless of a position of the pixel array 100. A ground voltage (GND) may always be applied to the first pickup region 220. The first pickup region 220 may be disposed between two adjacent unit pixel groups 110 of the plurality of unit pixel groups 110, and may have a dot shape. Herein, the first pickup region 220 may be disposed between two adjacent output parts 113 in order to effectively suppress the blooming phenomenon using the second pickup region 212. Thus, the first pickup regions 220 may be arranged alternately with the second pickup regions 212 in any direction, for example, the column direction.

As described above, the pixel array 100, according to the third embodiment, may include the first and second pickup regions 212 and 220, which may more effectively suppress the blooming phenomenon.

Figure 8:
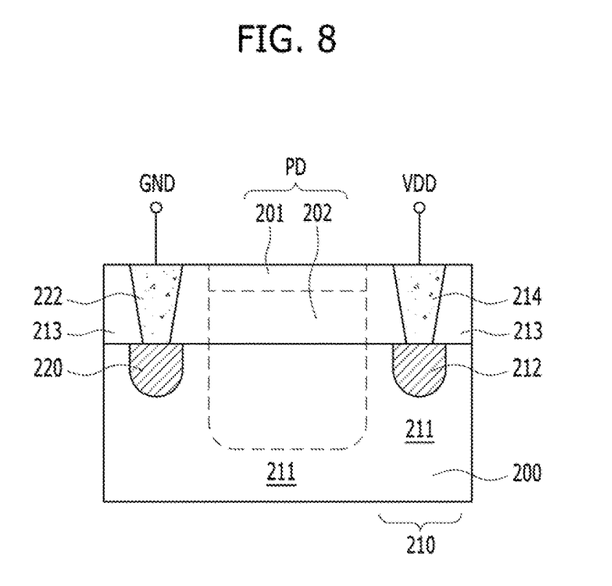
FIG. 8 is a cross-sectional view taken along line A-A' of the pixel array shown in FIG. 6, according to the fourth embodiment of the present invention.

FIG. 8 is a cross-sectional view taken along line A-A' of the pixel array of FIG. 6, according to the fourth embodiment of the present invention.

As shown in FIGS. 6 and 8, the pixel array 100 according to the fourth embodiment may include a plurality of unit pixel groups 110, an isolation structure 210 for insulating between the plurality of unit pixel groups 110, and a first pickup region 220 of a first conductivity-type formed in the isolation structure 210. Herein, the plurality of unit pixel groups 110 and the isolation structure 210 may be substantially the same as those described in the second embodiment, and thus the detailed description thereof will be omitted. For reference, the element isolation layer 213, the second plug 214 and the second pickup region 212, which may be included in the isolation structure 210 according to the fourth embodiment, may be substantially the same as the element isolation layer 213, the plug 214 and the pickup region, which are described above with reference to the second embodiment.

In the pixel array 100 according to the fourth embodiment, the first pickup region 220 of the first conductivity-type may serve to maintain the first conductivity-type conductive layer 211, for example, the P-type well 211, at a constant voltage level regardless of the position of the pixel array 100. A ground voltage (GND) may always be applied to the first pickup region 220 through the first plug 222 connected to the first pickup region 220 through the element isolation layer 213. The first pickup region 220 may be disposed between two adjacent unit pixel groups 110 of unit pixel groups 110, and may have a dot shape. Herein, the first pickup region 220 may be disposed between two adjacent output parts 113 of the output parts 113 in order to effectively suppress the blooming phenomenon by use of the second pickup region 212. Thus, the first pickup regions 220 may be arranged alternately with the second pickup regions 212 in the column direction.

As described above, the pixel array 100, according to the fourth embodiment, may include the first and second pickup regions 212 and 220, which may effectively suppress the blooming phenomenon.

As described above, according to the present invention, the blooming phenomenon may be suppressed using the pickup region.

The aforementioned image sensor according to the embodiment may be applied to various electronic devices. Hereinafter, with reference to FIG. 9, an example of an electronic device including the image sensor according to an embodiment of the invention is described. Specifically, the electronic device of FIG. 9 may be a digital still camera capable of capturing a still image.

Figure 9:
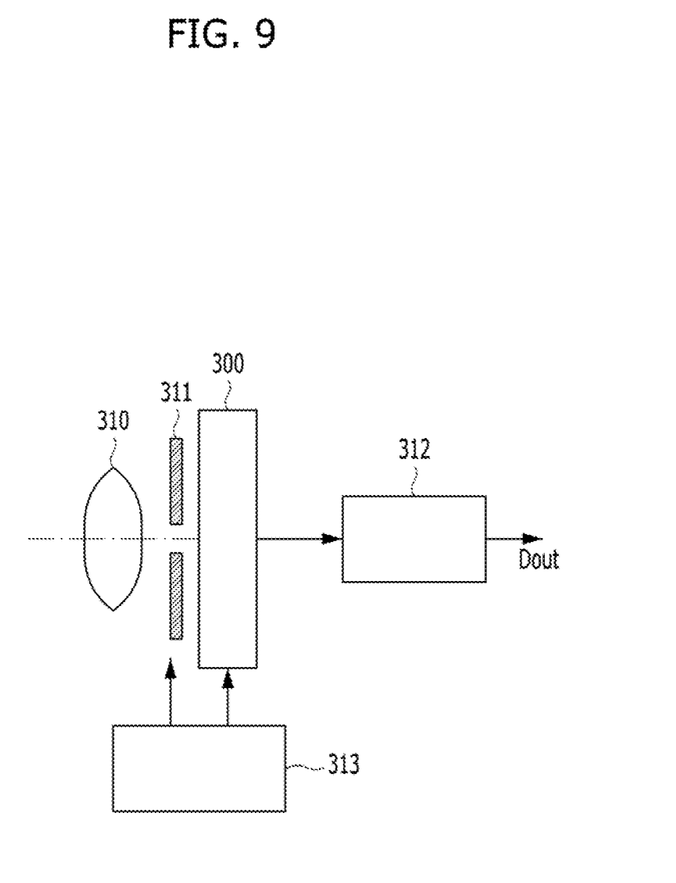
FIG. 9 is a diagram illustrating an electronic device, according to an embodiment of the present invention.

As illustrated in FIG. 9, the electronic device may include an optical lens 310, a shutter 311, an image sensor 300, a driving circuit 313, and a signal processing circuit 312. The image sensor 311 may have the same configuration as the image sensor including the pixel array 100 shown in FIGS. 2 to 8.

The optical lens 310 may form an image of incident light from an object on an imaging surface of the image sensor 300. Thus, charges corresponding to a signal may be accumulated in the image sensor 300 during a predetermined period. The driving circuit 313 may supply a transmission operation signal to the image sensor 300. The signal transmission of the image sensor 300 may be performed by a driving signal (or a timing signal) supplied from the driving circuit 313. The signal processing circuit 312 may perform various types of signal processing. An image signal subject to the signal processing may be stored in a storage medium, such as a semiconductor memory device, or may be outputted to a monitor.

While the present invention has been described with respect to the specific embodiments, it will be apparent to those skilled in the art that various changes and modifications may be made without departing from the spirit and/or scope of the invention as defined in the following claims.

What is claimed is:

1. An image sensor comprising:
   a plurality of unit pixel groups; and
   an isolation structure suitable for insulating between the plurality of unit pixel groups,
   wherein the isolation structure comprises:
   a first conductivity-type conductive layer formed over a substrate; and
   a second conductivity-type pickup region formed in the first conductivity-type conductive layer and disposed between two adjacent unit pixel groups,
   wherein the first conductivity-type conductive layer comprises either a first conductivity-type well formed in the substrate, or a first conductivity-type epitaxial layer formed over the substrate.

2. The image sensor of claim 1, wherein the isolation structure further comprises:
   an element isolation layer formed over the first conductivity-type conductive layer and having a bottom surface in contact with the second conductivity-type pickup region; and
   a plug formed through the element isolation layer and connected to the second conductivity-type pickup region.

3. The image sensor of claim 1, wherein a positive voltage variable within a voltage range from a voltage higher than a ground voltage to a voltage equal to or lower than a supply voltage is applied to the second conductivity-type pickup region.

4. The image sensor of claim 1, wherein when the plurality of unit pixel groups operate in a global shutter mode, a positive voltage is applied to the second conductivity-type pickup region during an integration time.

5. The image sensor of claim 1, wherein when the plurality of unit pixel groups operate in a rolling shutter mode, a positive voltage is always applied to the second conductivity-type pickup region.

6. The image sensor of claim 1, wherein each of the plurality of unit pixel groups comprises:
   a light-receiving part comprising a plurality of photoelectric conversion elements suitable for generating photocharges in response to incident light and sharing a single floating diffusion region; and
   an output part suitable for outputting an image signal corresponding to the photocharges generated in the light-receiving part.

7. The image sensor of claim 6, wherein the second conductivity-type pickup region is disposed between two adjacent light-receiving parts.

8. An image sensor comprising:
   a plurality of unit pixel groups; and
   an isolation structure suitable for insulating between the plurality of unit pixel groups,
   wherein the isolation structure comprises:
   a first conductivity-type conductive layer formed over a substrate; and
   a second conductivity-type pickup region formed in the first conductivity-type conductive layer and disposed between the plurality of unit pixel groups,
   wherein the second conductivity-type pickup region has a dot shape.

9. An image sensor comprising:
   a plurality of unit pixel groups;
   an isolation structure suitable for insulating between the plurality of unit pixel groups; and
   a first pickup region of a first conductivity-type formed in the isolation structure and disposed between two adjacent unit pixel groups,
   wherein the isolation structure comprises:
   a first conductivity-type conductive layer; and
   a second pickup region of a second conductivity-type formed in the first conductivity-type conductive layer and disposed between two adjacent unit pixel groups,
   wherein the first and second pickup regions have a dot shape.

10. The image sensor of claim 9, wherein the isolation structure further comprises:
    an element isolation layer formed over the first conductivity-type conductive layer and having a bottom surface in contact with the first and second pickup regions;
    a first plug formed through the element isolation layer and connected to the first pickup region; and
    a second plug formed through the element isolation layer and connected to the second pickup region.

11. The image sensor of claim 9, wherein a positive voltage variable within a voltage range from a voltage higher than a ground voltage to a voltage equal to or lower than a supply voltage is applied to the second pickup region.

12. The image sensor of claim 9, wherein when the plurality of unit pixel groups operate in a global shutter mode, a positive voltage is applied to the second pickup region during an integration time.

13. The image sensor of claim 9, wherein when the plurality of unit pixel groups operate in a rolling shutter mode, a positive voltage is always applied to the second pickup region.

14. The image sensor of claim 9, wherein a ground voltage is applied to the first pickup region.

15. The image sensor of claim 9, wherein the first conductivity-type conductive layer comprises either a first conductivity-type well formed in the substrate, or a first conductivity-type epitaxial layer formed over the substrate.

16. The image sensor of claim 9, wherein each of the plurality of unit pixel groups comprises:
   a light-receiving part comprising a plurality of photoelectric conversion elements suitable for generating photocharges in response to incident light and sharing a single floating diffusion region; and
   an output part suitable for outputting an image signal corresponding to the photocharges generated in the light-receiving part.

17. The image sensor of claim 16, wherein the first pickup region is disposed between two adjacent output parts.

18. The image sensor of claim 16, wherein the second pickup region is disposed between two adjacent light-receiving parts.

* * * * *